(12) United States Patent
Yamaji

(10) Patent No.: US 8,242,572 B2
(45) Date of Patent: Aug. 14, 2012

(54) SEMICONDUCTOR APPARATUS

(75) Inventor: Masaharu Yamaji, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 93 days.

(21) Appl. No.: 12/917,719

(22) Filed: Nov. 2, 2010

(65) Prior Publication Data
US 2011/0133269 A1 Jun. 9, 2011

(30) Foreign Application Priority Data

Nov. 2, 2009 (JP) ................................. 2009-251946

(51) Int. Cl.
*H01L 23/58* (2006.01)
(52) U.S. Cl. ........ 257/492; 257/493; 257/491; 257/495; 438/268
(58) Field of Classification Search .................. 257/492, 257/491, 493, 495, 487, 328, E29.261; 438/268
See application file for complete search history.

(56) References Cited

U.S. PATENT DOCUMENTS

| | | | | |
|---|---|---|---|---|
| 6,124,628 | A * | 9/2000 | Fujihira et al. ................. | 257/630 |
| 2004/0119132 | A1 | 6/2004 | Akiyama et al. | |
| 2005/0056906 | A1 | 3/2005 | Jimbo et al. | |
| 2006/0071271 | A1* | 4/2006 | Omura et al. ................. | 257/341 |
| 2006/0249807 | A1 | 11/2006 | Akiyama | |
| 2007/0013022 | A1 | 1/2007 | Shimizu | |
| 2008/0237631 | A1 | 10/2008 | Watanabe | |

FOREIGN PATENT DOCUMENTS

| | | |
|---|---|---|
| JP | 3489362 B2 | 1/2004 |
| JP | 2004-200472 A | 7/2004 |
| JP | 2005-064472 A | 3/2005 |
| JP | 3691943 B2 | 9/2005 |
| JP | 2006-313828 A | 11/2006 |
| JP | 2007-027358 A | 2/2007 |
| JP | 2008-244092 A | 10/2008 |

OTHER PUBLICATIONS

Fujihira, Tatsuhiko et al. "Proposal of New Interconnection Technique for Very High-Voltage IC's" Jpn. J. Appl Phys. , 1996, pp. 5655-5663, vol. 35. Japan.
Kim, S.L. et al. "Realization of Robust 600V High Side Gate Drive IC with a New Isolated Self-Shielding Structure" Proceedings of the 17th International Symposium on Power Semiconductor Devices & IC's, May 23-26, 2005, pp. 143-146, Santa Barbara, CA.
Terashima, Tomohide et al. "A New Level-shifting Technique by divided RESURF Structure" 1997, ISPSD (International Symposium on Power Semiconductor Devices and IC's), pp. 57-60.

* cited by examiner

*Primary Examiner* — Theresa T Doan
(74) *Attorney, Agent, or Firm* — Rossi, Kimms & McDowell LLP

(57) ABSTRACT

A semiconductor apparatus includes, below a high-voltage wiring, a p⁻ diffusion layer in contact with an n drain buffer layer and a p⁺ diffusion layer in contact with a p⁻ diffusion layer for reducing the electric field strength in an insulator film, which the high-voltage wiring crosses over. Reducing electric field strength in the insulator film prevents lowering of breakdown voltage of a high-voltage NMOSFET, break down of an interlayer insulator film, and impairment of isolation breakdown voltage of a device isolation trench. The semiconductor apparatus according to the invention facilitates bridging a high-voltage wiring from a high-voltage NMOSFET and such a level-shifting device to a high-voltage floating region crossing over a device isolation trench without impairing the breakdown voltage of the high-voltage NMOSFET, without breaking down the interlayer insulator film and without impairing the isolation breakdown voltage of the device isolation trench.

14 Claims, 12 Drawing Sheets

Control Circut    Driver Circut   Output Stage Device

SEMICONDUCTOR APPARATUS

BACKGROUND OF THE INVENTION

A. Field of the Invention

The present invention relates to semiconductor apparatuses of a dielectric isolation type that use a silicon-on-insulator (hereinafter referred to as a "SOI") substrate. Specifically, the invention relates to semiconductor apparatuses such as integrated circuits (hereinafter referred to as "IC's") for electric power conversion represented by high-voltage integrated circuits (hereinafter referred to as "HVIC's"). More specifically, the invention relates to a lateral double-diffused MOSFET (hereinafter referred to as an "LDMOSFET") of a high breakdown voltage class between 100 V and 1200 V and such a semiconductor device used in the semiconductor apparatuses.

B. Description of the Related Art

A SOI substrate which facilitates isolating devices from each other perfectly by a trench dielectric isolation (insulation for the side area) and by an insulator layer (insulation for the bottom area) has been attracting much attention recently to meet demands for providing power IC's incorporating a high-voltage device therein with a higher breakdown voltage. Formation of a high-voltage power converter IC on a SOI substrate is advantageous for preventing the malfunction caused at the switching by a parasitic device from occurring, for preventing the interference caused by noise from occurring, and for reducing the parasitic capacitance.

The dielectric isolation technique that employs a trench is applicable to the edge structure and the high-voltage junction termination structure (hereinafter referred to as the "HVJT") in the devices in the IC. Therefore, it is also expected to reduce the IC chip size itself.

FIG. 9(a) is the top plan view of a conventional dielectric-isolation-type semiconductor apparatus. FIG. 9(b) is the cross sectional view along the broken line X-X in FIG. 9(a). In these drawings, SOI substrate 50 is used. SOI substrate 50 includes supporting base 51, dielectric layer 52 on supporting base 51, and n⁻ semiconductor layer 53 on dielectric layer 52. Dielectric layer 52 isolates supporting base 51 and n⁻ semiconductor layer 53 from each other. Isolation trench 54 including a silicon oxide film loaded therein isolates n⁻ semiconductor layer 53 in the lateral direction such that isolation trench 54 marks off n⁻ semiconductor layer 53.

The n⁻ semiconductor layer 53 marked off works as high-potential floating region (herein after referred to as "HV floating region") 67 including a driver circuit and an output stage device formed therein. High-voltage NMOSFET (hereinafter referred to as "HV NMOSFET") 70 is formed as a level-shifting device in a predetermined range in n⁻ semiconductor layer 53.

In FIG. 9(b), HV NMOSFET 70 employs n⁻ semiconductor layer 53 for the n⁻ drift drain layer thereof. HV NMOSFET 70 includes, in the central surface portion on the upper side of n⁻ semiconductor layer 53, heavily doped n⁺ drain layer 59 and n drain buffer later 58, the resistance of which is higher than the n⁺ drain layer 59 resistance.

Spaced apart from n drain buffer layer 58, p well diffusion layer 55 is formed such that p well diffusion layer 55 surrounds n drain buffer layer 58. In p well diffusion layer 55, n⁺ source layer 56 and p⁺ pickup layer 57 are formed.

Gate electrode 61 is formed above n⁺ source layer 56, p well diffusion layer 55 and the n⁻ drift drain layer (n⁻ semiconductor layer 53) with a gate insulator film interposed between these layers and gate electrode 61. Source electrode 63 and drain electrode 64 are connected to n⁺ source layer 56 and n⁺ drain layer 59, respectively. Source electrode 63 and drain electrode 64 are insulated from each other by field oxide film 62. Drain electrode 64 and source electrode 63 extend above the n⁻ drift drain layer (n⁻ semiconductor layer 53) such that drain electrode 64 and source electrode 63 serve as field plates.

As supporting base 51, source electrode 63 and gate electrode 61 are fixed at the ground (GND) potential and a positive bias voltage applied to drain electrode 64 is raised gradually. A depletion layer extends from the pn-junction between p well diffusion layer 55 and n⁻ semiconductor layer 53. Since supporting base 51 is fixed at the GND potential, a depletion layer extends also from the boundary between dielectric layer 52 and n⁻ semiconductor layer 53. Since the depletion layers extend in the lateral and vertical directions in n⁻ semiconductor layer 53, the surface electric field of the n⁻ drift drain layer (n⁻ semiconductor layer 53) is relaxed. This effect is called generally the "RESURF effect".

The distance Ld of the n⁻ drift drain layer is set to be sufficiently long. The impurity concentration in the n⁻ drift drain layer is adjusted at an optimum value. The extending lengths of the field plates described above are optimized. Even if a high voltage is applied to drain electrode 64, the surface electric field will be relaxed, the electric field will not localize to the pn-junction and no avalanche breakdown will be caused in the semiconductor layer 53 surface due to the optimum designs described above.

The avalanche breakdown occurs on the boundary between n⁻ semiconductor layer 53 and dielectric layer 52. When the RESURF conditions are met, the breakdown voltage Vbr of HV NMOSFET 70 that constitutes the dielectric-isolation-type semiconductor apparatus is expressed generally by the following formula (1).

$$Vbr = Ecr \times ((d/2) + Tox \times \in si / \in ox) \quad (1)$$

Here, Ecr is the critical electric field (unit: V/cm), d the n⁻ semiconductor layer thickness (unit: μm), Tox the dielectric layer thickness (unit: μm), ∈si the relative dielectric permeability of silicon, and ∈ox the relative dielectric permeability of the dielectric material.

When n⁻ semiconductor layer 53 is made of silicon and dielectric layer 52 is made of a silicon oxide film, Ecr is replaced by 3×10⁵ V/cm, d by 20 μm, Tox by 5 μm, ∈si by 11.7, and ∈ox by 3.9, then, Vbr will be 750 V.

If the specific resistance distribution in n⁻ semiconductor layer 53, the thickness distribution of dielectric layer 52 and the substantial breakdown voltage of a power MOSFET and such a switching device driven by the HVIC are considered, it will be required for HV NMOSFET 70 and a high-voltage bootstrap diode to exhibit a breakdown voltage of around 750 V at least, when the product specification is 600 V. HV NMOSFET 70 and the high-voltage bootstrap diode are mounted on the HVIC as a level-shifting device.

It is effective to increase the thickness d of n⁻ semiconductor layer 53 or the thickness Tox of dielectric layer 52 as the above-described formula (1) indicates to provide the dielectric-isolation-type semiconductor apparatus with a higher breakdown voltage.

However, there exist certain limitations on the manufacturing process such as the etching width and thickness of the trench and the oxide film formation in the trench. The limitations limit the thickness of n⁻ semiconductor layer 53. The trench insulates the devices from each other in the lateral direction in n⁻ semiconductor layer 53 and marks off n⁻ semiconductor layer 53. Therefore, 10 to 20 μm is the practical value for the thickness d of n⁻ semiconductor layer 53.

When a bonded SOI substrate is used for SOI substrate 50, the wafer warp in the IC manufacturing process causes a more serious problem, as SOI substrate 50 is thicker. As the SOI substrate 50 thickness is larger, the deposition period, during which dielectric layer 52 is deposited in a high-temperature furnace, becomes longer, increasing the manufacturing costs of SOI substrate 50. In addition to this, the thickening of dielectric layer 52 shortens the extension of the depletion layer extending from the junction plane between dielectric layer 52 and n⁻ semiconductor layer 53. Therefore, the RESURF effects described above are reduced. Since the electric field in the surface of the dielectric-isolation-type semiconductor apparatus becomes higher, the breakdown voltage is lowered. Therefore, it will be difficult to mass-produce semiconductor apparatuses exhibiting a higher breakdown voltage and using SOI substrate 50 having the thickness Tox of 6 μm or thicker, if the breakdown voltage, the manufacturing costs of the substrate and the substrate warping are considered.

As described above, HV NMOSFET 70 is formed on SOI substrate 50 including dielectric layer 52 and n⁻ semiconductor layer 53, and the thickness and impurity concentrations thereof are optimized to meet the requirement of realizing a higher breakdown voltage. When HV NMOSFET 70 (n-channel MOSFET) is integrated into a chip for mounting HV NMOSFET 70 on an HVIC and such an IC for electric power conversion, it is necessary to bridge high-voltage wiring (hereinafter referred to as "HV wiring") 68 from drain electrode 64 of HV NMOSFET 70 working as a level shifter to HV floating region 67 with an aluminum wiring and such a metal wiring. HV floating region 67 is an island-shaped floating region surrounded by isolation trench 66. The reference potential terminal of HV floating region 67 is connected to the low-potential-side terminal of a high-voltage switching device driven by a high-side driver circuit. HV floating region 67 is provided with the high-side driver circuit that drives the high-voltage switching device.

Japanese Patent Publication No. 3489362 describes the arrangement of a wiring from the central electrode (drain electrode) of a high-voltage NMOSFET (hereinafter referred to as an "HV NMOSFET") isolated by dielectric isolation. The wiring crosses over outer semiconductor layers (an n⁺ source layer and a p well layer). However, since the n⁻ semiconductor layer potential is drawn by the drain electrode potential, the electric field localizes in the vicinity of the n⁺ source layer and p well layer. Therefore, the uniform breakdown voltage design is impaired and an avalanche breakdown is caused at a low voltage in the regions below the wiring, causing a low breakdown voltage.

FIG. 10(a) is the plan view of a conventional one-chip inverter of a dielectric isolation type described in Japanese Unexamined Patent Application Publication No. 2005-64472. FIG. 10(b) is the cross sectional view along the single-dotted chain line G-G' in FIG. 10(a). As shown in FIG. 10(b), high-voltage wiring 153 is bridged from an HV NMOSFET on a SOI substrate crossing over dielectric isolation trench 154, that is, an HVJT. Since high-voltage wiring 153 crosses over the silicon substrate at the ground (GND) potential, Japanese Unexamined Patent Application Publication No. 2005-64472 points out that the dielectric breakdown of interlayer insulator film 155 and dielectric isolation trench 154 is provable.

The interlayer insulator film 155 may be thickened or the opening width of dielectric isolation trench 154 may be widened to prevent dielectric breakdown from occurring. However, these countermeasures make it more difficult to conduct the step of burying a contact, the step of trench etching, the step of filling the trench with a required material, and a machining step. As a result, a stable manufacturing process will not be obtained.

In FIG. 10(b), source electrode 151, drain electrode 152, p well diffusion layer 160, p diffusion layer (RESURF region) 164, and dielectric isolation trench 154 are shown.

T. Fujihira et al., "Proposal of New Interconnection Technique for Very High-Voltage IC's", Jpn. J. Appl. Phys., (35) 1996, pp. 5655-5663, T. Terashima et al., "A New Level-Shifting Technique by divided RESURF Structure", ISPSD (International Symposium on Power Semiconductor Devices & ICs), 1997, pp. 57-60, and S. L. Kim et al., "Realization of Robust 600V High Side Gate Drive IC with a New Isolated Self-Shielding Structure", Proceeding of the 17$^{th}$ International Symposium on Power Semiconductor Devices & ICs, 2005, pp. 143-146 all report on high-voltage wiring techniques (HV interconnection techniques) for high-voltage devices. These three documents each report a junction isolation method that employs an epitaxial substrate for isolating the circumstance below the HV interconnection or a self-isolation method that uses diffusion layers in a usual silicon substrate for isolating the circumstance below the HV interconnection. In documents, there is no description of a HV interconnection that crosses over a dielectric isolation trench or such a device isolation trench. This indicates that the HV interconnection, which crosses over a dielectric isolation trench and such a device isolation trench, causes a leakage current and such various problems due to the electric field localization in the vicinity of the device isolation trench and the impaired isolation performance, posing high technical difficulties.

For bridging an HV wiring from an HV NMOSFET isolated by dielectric isolation to an adjacent or spaced-apart region isolated by dielectric isolation (e.g. a high-voltage floating region), an HV wiring technique with a wire is employed as described in Japanese Unexamined Patent Application Publication No. 2006-313828. This document describes a method for maintaining the breakdown voltage of the semiconductor apparatus at a high value by arranging, in the lamination direction of dielectric layers, another dielectric layer in adjacent to the dielectric layers.

Japanese Unexamined Patent Application Publication No. 2004-200472 describes the formation of a second buried oxide film by etching the bask surface thereof so that the breakdown voltage of a semiconductor apparatus is not determined depending on the dielectric layer thickness Tox nor on the semiconductor layer thickness d.

Japanese Unexamined Patent Application Publication No. 2007-27358 describes the junction structure of a high-voltage semiconductor device and a high-voltage floating region isolated by dielectric isolation. In the junction structure, multiple isolation trenches and the high-voltage semiconductor device are formed in contact with each other as shown in FIG. 11.

FIG. 12(a) is a cross sectional view of the semiconductor apparatus disclosed in Japanese Unexamined Patent Application Publication No. 2008-244092. FIG. 12(b) is a top plan view of the semiconductor apparatus disclosed in that document.

Japanese Unexamined Patent Application Publication No. 2008-244092 describes the formation of a p⁻ layer (the layer denoted by "p⁻" in FIG. 12(a)) of a floating potential arranged in a ring-shape below a high-voltage wiring led out from the drain electrode of a high-voltage LDMOSFET formed on an n⁻ semiconductor layer in a SOI substrate. The p⁻ layer is formed to relax the electric field under the drain wiring of the high-voltage MOSFET having a dielectric isolation structure as shown in FIGS. 12(a) and 12 (b). When a high voltage is applied to the drain electrode in this structure, the lightly doped p⁻ layer is depleted to maintain a high breakdown voltage and the potential distributes with a gradient from an n⁺ drain layer toward an n⁺ source layer and the trench.

However, the HV wiring by a wire connection is accompanied by, in applying the dielectric-isolation-type semiconductor apparatus on a SOI substrate to a one-chip inverter, bondings inside the chip for connecting the HV NMOSFET, a level shifter, to the IN (input) terminal of a high-side driver circuit in the high-voltage floating region. Therefore, an additional area is necessary for the inside-the-chip bondings. It is also necessary to add a protector element against electrostatic discharge (ESD) for the IN (input) terminal, enlarging the chip size and increasing the manufacturing costs and assembly costs of the chip.

In the structure described in Japanese Unexamined Patent Application Publication No. 2007-27358, multiple isolation trenches are formed as shown in FIG. 11, such that the isolation trenches penetrate into the central region of the drain in the high-voltage semiconductor device, which is a high-voltage MOSFET. The multiple isolation trenches are arranged continuously from the center of the drain region in the high-voltage MOSFET to the edge area thereof. The isolation trenches formed inside the drift region of the high-voltage MOSFET are arranged perpendicular to (at right angles with respect to) the direction from the gate electrode edge to the drain electrode.

Due to the isolation trench arrangement, when a high voltage is applied to the drain electrode, a leakage current will be caused in the vicinity of the point I shown in FIG. 11 from the source to the drain along the trench side wall, since the isolation trenches are arranged in contact with the drain electrode.

The heavily doped drain layer is in contact with the isolation trenches with low resistance and the isolation trenches are in contact with the heavily doped source layer with low resistance. Therefore, a potential gradient is caused between the point at which the isolation trenches are connected to the drain layer and the point at which the isolation trenches are connected to the source layer. As a result, carriers move along the trench side wall due to the defects existing in the trench side wall, causing a leakage current.

In Japanese Unexamined Patent Application Publication No. 2008-244092, the n drain buffer layer surrounding the heavily doped n⁺ drain layer formed in the drain region is not in contact with the above-described p⁻ diffusion layer at a floating potential. Therefore, the potential drop in the n⁻ semiconductor layer below the HV wiring has a large gradient as described later with reference to FIG. 7(b). As a result, a large potential difference is caused between the n⁻ semiconductor layer and the high-potential floating region adjoining to the oxide film in the trench crossing below the HV wiring (the J point shown in FIG. 12(b)).

Therefore, in order to prevent the dielectric breakdown and isolation performance impairment of the oxide film in the trench from occurring, it is necessary to increase the trench width as shown in FIG. 12(a). If the trench width is increased, it will take a longer time to deposit insulator films in the trenches and it will be necessary to add a step of flattening the deposited insulator films, causing an increase in the number of manufacturing steps.

The structure according to the invention includes, below an HV wiring connecting an n⁺ drain layer and a high-voltage floating region crossing over a trench isolation region, a p⁻ diffusion layer (RESURF layer) in contact with an n drain buffer layer surrounding the n⁺ drain layer, and p⁺ diffusion layer (stopper region) in contact with the p⁻ diffusion layer.

The structure according to the invention is not described in any of the above-described documents.

In view of the foregoing, it would be desirable to obviate the problems described above. It would be also desirable to provide a semiconductor apparatus, including an HV NMOSFET formed on a SOI substrate, a drain in the HV NMOSFET, a source in the HV NMOSFET surrounding the drain, and an HV wiring connected to the drain and connecting the HV NMOSFET to the outside, that facilitates preventing the breakdown voltage lowering due to the HV wiring from causing in the HV NMOSFET, the breakdown of an interlayer insulator film due to the HV wiring from causing and the isolation breakdown voltage lowering due to the HV wiring from causing in the device isolation trench. It also would be desirable to provide a semiconductor apparatus with a small area and with low manufacturing costs.

The present invention is directed to overcoming or at least reducing the effects of one or more of the problems set forth above.

SUMMARY OF THE INVENTION

According to the subject matter of the appended claim 1, there is provided a semiconductor apparatus including:
a supporting base;
a first insulator film on the supporting base;
a semiconductor layer of a first conductivity type on the first insulator film;
a trench extended from the surface of the semiconductor layer to the first insulator film, the trench including a second insulator film buried therein;
a first semiconductor layer of the first conductivity type surrounded by the trenches;
a second semiconductor layer of the first conductivity type in the surface portion of one of the first semiconductor layers, the second semiconductor layer being doped more heavily than the first semiconductor layer;
a third semiconductor layer of a second conductivity type in the surface portion of the one of the first semiconductor layers, the third semiconductor layer being formed selectively around the second semiconductor layer with a certain spacing left between the third semiconductor layer and the second semiconductor layer;
a fourth semiconductor layer of the first conductivity type in the surface portion of the third semiconductor layer, the fourth semiconductor layer being doped more heavily than the third semiconductor layer;
a fifth semiconductor layer of the second conductivity type in the surface portion of the third semiconductor layer, the fifth semiconductor layer being doped more heavily than the third semiconductor layer;
a first main electrode in contact with the second semiconductor layer;
a second main electrode in contact with the fourth and fifth semiconductor layers;
a gate electrode above the extended portion of the third semiconductor layer extended between the fourth semiconductor layer and the one of the first semiconductor layers with a gate insulator film interposed between the gate electrode and the extended portion;
a sixth semiconductor layer of the second conductivity type in the surface portion of the one of first semiconductor layers, the sixth semiconductor layer being in contact with the second semiconductor layer, the sixth semiconductor layer being extended toward the trench;
a seventh semiconductor layer of the second conductivity type in the surface portion of the one of the first semiconductor layers, the seventh semiconductor layer being in contact with the sixth semiconductor layer, the seventh semiconductor layer being extended toward the trench, the seventh semiconductor layer being doped more heavily than the sixth semiconductor layer;

a high-potential wiring above the sixth and seventh semiconductor layers with a third insulator film interposed between the high-potential wiring and the sixth and seventh semiconductor layers, the high-potential wiring connecting the first main electrode and the other one of the first semiconductor layers in adjacent to the one of the first semiconductor layers crossing over the trench; and the third semiconductor layer being spaced apart from the seventh semiconductor layer so as not to make the third semiconductor layer cross the seventh semiconductor layer.

According to the subject matter of the appended claim 2, there is provided a semiconductor apparatus including:
a supporting base;
a first insulator film on the supporting base;
a semiconductor layer of a first conductivity type on the first insulator film; a trench extended from the surface of the semiconductor layer to the first insulator film, the trench including a second insulator film buried therein;
a first semiconductor layer of the first conductivity type surrounded by the trenches;
a second semiconductor layer of the first conductivity type in the surface portion of one of the first semiconductor layers, the second semiconductor layer being doped more heavily than the first semiconductor layer;
a third semiconductor layer of a second conductivity type in the surface portion of the one of the first semiconductor layers, the third semiconductor layer being formed around the second semiconductor layer with a certain spacing left between the third semiconductor layer and the second semiconductor layer;
a fifth semiconductor layer of the second conductivity type in the surface portion of the third semiconductor layer, the fifth semiconductor layer being doped more heavily than the third semiconductor layer;
a first main electrode in contact with the second semiconductor layer;
a second main electrode in contact with the fifth semiconductor layer;
a sixth semiconductor layer of the second conductivity type in the surface portion of the one of first semiconductor layers, the sixth semiconductor layer being in contact with the second semiconductor layer, the sixth semiconductor layer being extended toward the trench;
a seventh semiconductor layer of the second conductivity type in the surface portion of the one of the first semiconductor layers, the seventh semiconductor layer being in contact with the sixth semiconductor layer, the seventh semiconductor layer being extended toward the trench, the seventh semiconductor layer being doped more heavily than the sixth semiconductor layer;
a high-potential wiring above the sixth and seventh semiconductor layers with a third insulator film interposed between the high-potential wiring and the sixth and seventh semiconductor layers, the high-potential wiring connecting the first main electrode and the other one of the first semiconductor layers in adjacent to the one of the first semiconductor layers crossing over the trench; and the third semiconductor layer being spaced apart from the seventh semiconductor layer so as not to make the third semiconductor layer cross the seventh semiconductor layer.

According to the subject matter of the appended claim 3 or 11, the spacing, across which the third semiconductor layer and the seventh semiconductor layer are facing to each other, is longer than the spacing, across which the third semiconductor layer and the second semiconductor layer are facing to each other.

According to the subject matter of the appended claim 4, the semiconductor apparatus includes a MOSFET, in which
the second semiconductor layer is formed of a drain buffer layer and a drain layer in the surface portion of the drain buffer layer or the second semiconductor layer is a drain layer,
the third semiconductor layer is a well diffusion layer,
the fourth semiconductor layer is a source layer, and
the fifth semiconductor layer is a pickup layer.

According to the subject matter of the appended claim 5, the semiconductor apparatus includes a diode, in which
the second semiconductor layer is formed of a cathode buffer layer and a cathode layer in the surface portion of the cathode buffer layer or the second semiconductor layer is a cathode layer, and
the third semiconductor layer is formed of a well diffusion layer and an anode layer in the surface portion of the well diffusion layer or the third semiconductor layer is an anode layer.

According to the subject matter of the appended claim 6 or 12, the semiconductor apparatus further includes a first field plate electrode connected to the first main electrode and extended toward the second main electrode, and a second field plate electrode connected to the second main electrode and extended toward the first main electrode.

According to the subject matter of the appended claim 7, the semiconductor apparatus includes a high-voltage NMOSFET in the one of the first semiconductor layers, and a high-potential floating region in the other one of the first semiconductor layers in adjacent to the one of the first semiconductor layers.

According to the subject matter of the appended claim 8, the semiconductor apparatus includes a high-voltage diode in the one of the first semiconductor layers, and a high-potential floating region in the other one of the first semiconductor layers in adjacent to the one of the first semiconductor layers.

According to the subject matter of the appended claim 9, the trenches include a first trench surrounding the one of the semiconductor layers and second trenches surrounding the other one of the semiconductor layers, and the first trench is connected to the second trenches in the area, in which the third semiconductor layer is not between the second semiconductor layer and the first and second trenches.

According to the subject matter of the appended claim 10 or 14, the first trench is butted to the side wall of the second trench or the second trench is butted to the side wall of the first trench in a planar pattern shaped with a letter T and at a butting angle of 60 to 120 degrees of angle measured from the butted one of the trenches as a reference.

In the dielectric-isolation-type semiconductor apparatus according to the invention, a p$^-$ diffusion layer, in contact with an n$^+$ drain layer or with an n drift buffer layer, and a p$^+$ diffusion layer in contact with the p$^-$ diffusion layer are formed in an n$^-$ semiconductor layer below a high-potential wiring connecting the n$^+$ drain layer in a high-voltage NMOSFET to a high-potential floating region crossing over an insulator film in a trench, which is a device isolation region. The structure described above facilitates reducing the voltage and the strength of the electric field applied to the insulator film in the trench.

Since there is no region fixed at the ground potential below the high-voltage wiring, the interlayer insulator films (including a LOCOS oxide film) below the high-voltage wiring are prevented from dielectric breakdown. By forming the high-voltage wiring connected to the drain electrode with a metal wiring to provide the high-voltage wiring with a shielding effect, the adverse effects of the moveable ions in the mold resin are suppressed to be small. As a result, the breakdown voltage of the high-voltage NMOSFET is prevented from lowering and the long-term reliability of the dielectric-isolation-type semiconductor apparatus is improved. When a high-voltage diode is formed in substitution for the high-voltage NMOSFET, the same effects are obtained.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Now the invention will be described in detail below with reference to the accompanied drawings which illustrate the preferred embodiments of the invention.

In the following descriptions and the accompanied drawings, the first conductivity type is n and the second conductivity type is p, although the conductivity types may be reversed with no problem. The sign − next to the letter "n" or "p" indicating the conductivity type of a region or a layer indicates that the region or the layer is doped relatively lightly (lowly). The sign + next to the letter "n" or "p" indicating the conductivity type of a region or a layer indicates that the region or the layer is doped relatively heavily (highly). When neither the sign + nor the sign − is present, the region or the layer is doped intermediately.

First Embodiment

Figure 1:
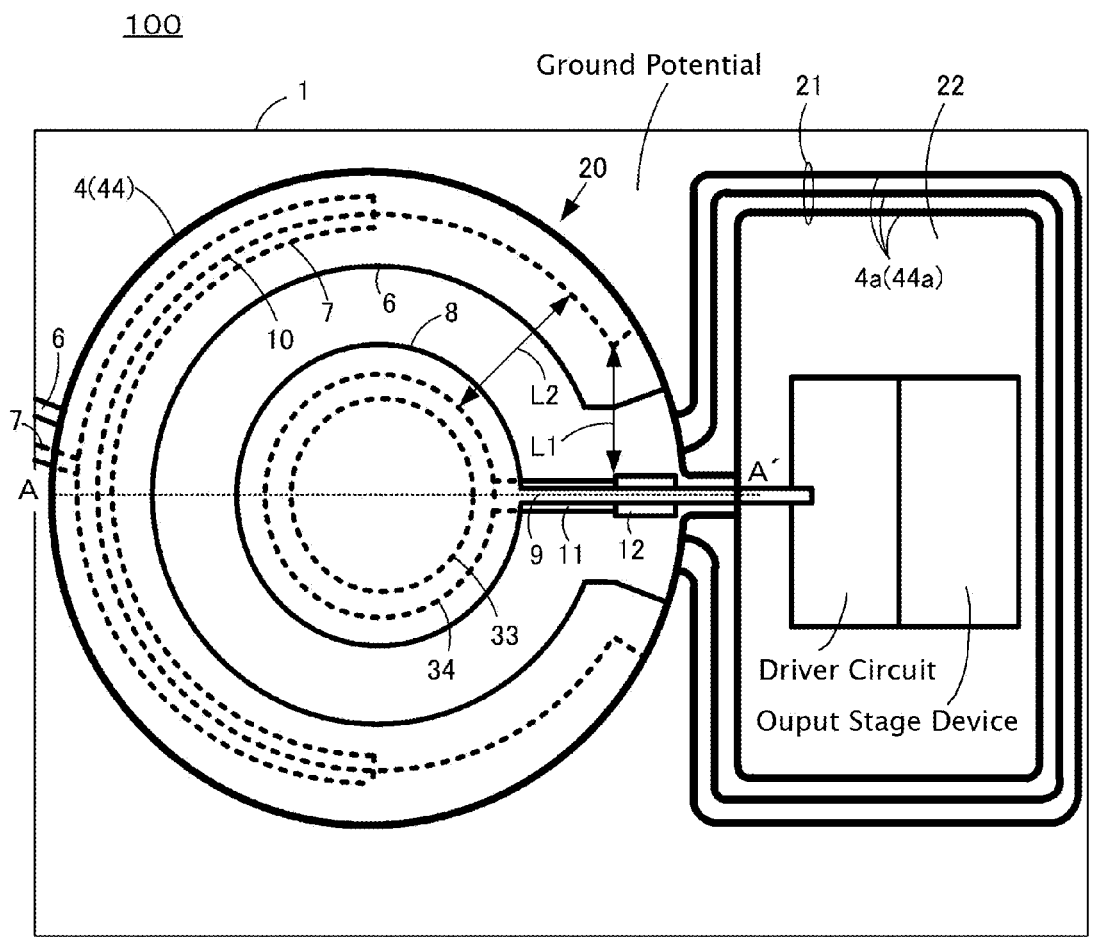
FIG. 1 is a top plan view of a semiconductor apparatus according to a first embodiment of the invention.
Figure 2:
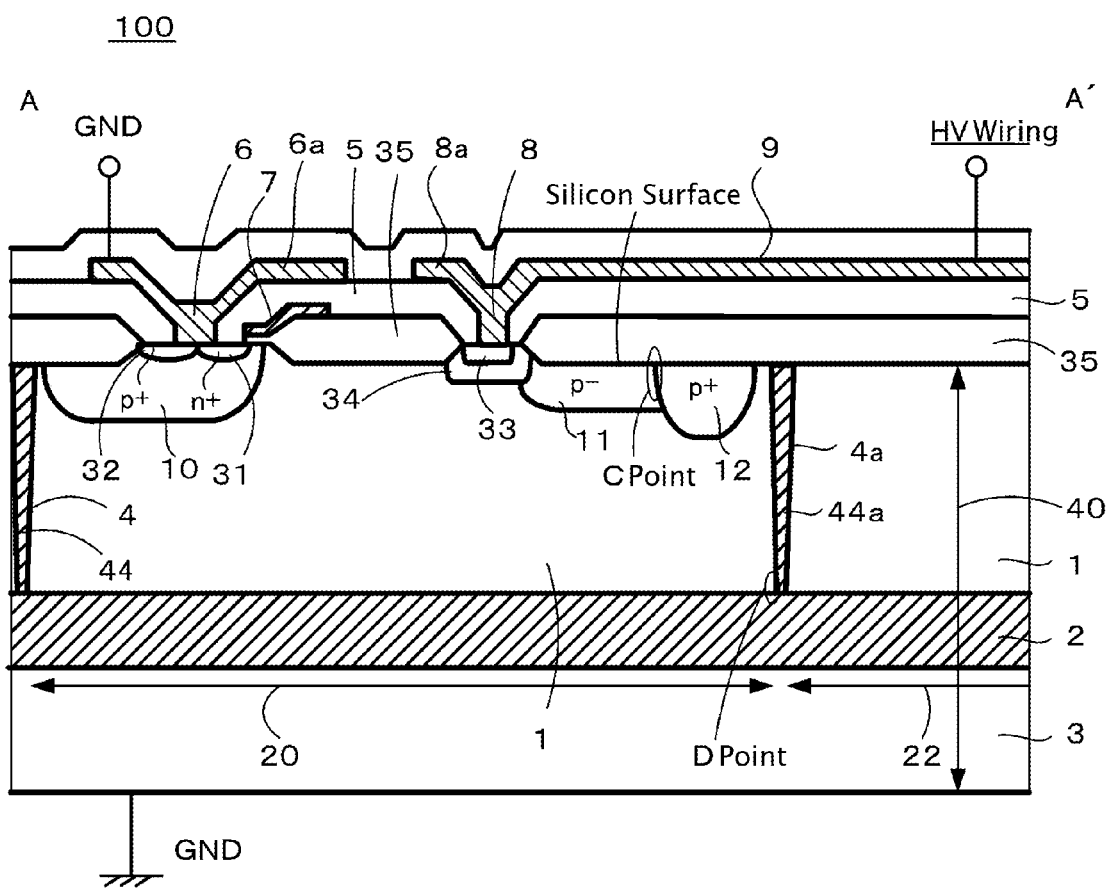
FIG. 2 is a cross sectional view along the broken line A-A' in FIG. 1.

FIG. 1 is a top plan view of a semiconductor apparatus according to a first embodiment of the invention. FIG. 2 is a cross sectional view along the broken line A-A' in FIG. 1.

Referring now to these drawings, semiconductor apparatus 100 according to the first embodiment of the invention is a one-chip HVIC and is a dielectric-isolation-type semiconductor apparatus including high-voltage NMOSFET (hereinafter referred to as "HV NMOSFET") 20 isolated by dielectric isolation and high-potential floating region (hereinafter referred to as "HV floating region") 22. HV NMOSFET 20 and HV floating region 22 are formed respectively in n− semiconductor layers 1 surrounded by insulator films 44 and 44a buried in trenches 4 and 4a.

HV NMOSFET 20 is a level-shifting device functioning as a level shifter that receives an input signal from a low-voltage control circuit and transmits a set signal or a reset signal to a high-side driver circuit. The reference potential terminal of HV floating region 22 including the high-side driver circuit is connected to the low-potential-side terminal among the main terminals of a high-voltage switching device (IGBT or NMOSFET) driven by the high-side driver circuit. Every time the gate of the high-voltage switching device is driven, a high voltage of around several hundred V is applied thereto. Therefore, every time the high-voltage switching device in the outside is turned on and off, a high voltage of around several hundred V is applied also to the drain electrode of HV NMOSFET 20. Therefore, it is required for semiconductor apparatus 100 to exhibit a high breakdown voltage.

In forming semiconductor apparatus 100, SOI substrate 40, including supporting base 3, buried dielectric layer 2 on supporting base 3 and n− semiconductor layer 1 on buried dielectric layer 2, is used. Buried dielectric layer 2 performs dielectric isolation of supporting base 3 and n− semiconductor layer 1. In other words, buried dielectric layer 2 insulates supporting base 3 and n− semiconductor layer 1 electrically from each other.

The dielectric isolation in the horizontal (lateral) direction in n− semiconductor layer 1 is conducted by the trench dielectric isolation structure including trenches 4 and 4a and silicon oxide films and such insulator films 44 and 44a in trenches 4 and 4a. Insulator films 44 and 44a isolate and mark off HV NMOSFET 20 and the devices formed in HV floating region 22. It is necessary to widen the trench width in order to prevent the performances of HV NMOSFET 20 formed in n⁻ semiconductor layer 1 surrounded by insulator film 44 buried in trench 4 from being impaired.

HV NMOSFET 20 employs n⁻ semiconductor layer 1 for the n⁻ drift drain layer thereof, and includes heavily doped n⁺ drain layer 33 in the central surface portion of n⁻ semiconductor layer 1. Heavily doped n⁺ drain layer 33 is formed in the surface portion of n drain buffer layer 34 and p well diffusion layer 10 is formed such that p well diffusion layer 10 is spaced apart from n drain buffer layer 34 and surrounding n drain buffer layer 34. In p well diffusion layer 10, n⁺ source layer 31 and p⁺ pickup layer 32 are formed.

Gate electrode 7 is formed above n⁺ source layer 31, p well diffusion layer 10 and n⁻ semiconductor layer 1 which is an n⁻ drift drain layer with LOCOS oxide film 35 interposed between these layers and gate electrode 7. Source electrode 6 is formed on n⁺ source layer 31. Drain electrode 8 is formed on n⁺ drain layer 33. Gate electrode 7 and source electrode 6 are insulated from each other by interlayer insulator film (ILD) 5. The silicon surface and gate electrode 7 are insulated from each other by LOCOS oxide film 35 (selective oxide film) working as a field oxide film.

Field plate electrodes 6a and 8a extending above n⁻ semiconductor layer 1 are connected to source electrode 6 and drain electrode 8 such that field plate electrodes 6a and 8a are a part of source electrode 6 and a part of drain electrode 8, respectively. The thickness Tox of buried dielectric layer 2 is set to be from 4.0 to 5.0 µm. The thickness Tsoi of n⁻ semiconductor layer 1 is set to be around 20.0 µm.

The width Lt of trenches 4 and 4a (hereinafter referred to as the "trench width") for dielectric isolation is set to be from 1.0 to 2.0 µm. Trenches 4 and 4a are over etched by dry etching in a trench etching apparatus to the depth Dt (hereinafter referred to as the "trench depth") of around 22 µm. Trenches 4 and 4a are filled with tetraethoxysilane (hereinafter referred to as "TEOS") oxide film and such an insulator film in a plasma CVD apparatus. Through these steps, trenches 4 and 4a are formed such that trenches 4 and 4a are extended to buried dielectric layer 2 and the trench width Lt of the contact area in the trench bottom is 1.0 µm or wider.

The p well diffusion layer 10 is formed by high-temperature thermal oxidation or by driving in a nitrogen gas ($N_2$) atmosphere such that the diffusion depth Xj thereof is around 3.5 µm. The n⁻ semiconductor layer 1 is formed using a very resistive n-type substrate; the specific resistivity thereof is from 10Ω·cm to 20Ω·cm. The impurity boron concentration in p well diffusion layer 10 is set to be from $1.0 \times 10^{17}$ cm⁻³ to $5.0 \times 10^{17}$ cm⁻³. The impurity arsenic concentration in n⁺ source layer 31 and n⁺ drain layer 33 is set to be $1 \times 10^{20}$ cm⁻³. The impurity phosphorus concentration in n drain buffer layer 34 is set to be from $3 \times 10^{16}$ cm⁻³ to $1 \times 10^{17}$ cm⁻³ and the diffusion depth Xj thereof to be between 2 µm and 4 µm. The impurity $BF_2$ concentration in p⁺ pickup layer 32 is set to be $1 \times 10^{20}$ cm⁻³. The drain drift length, which is the spacing between p well diffusion layer 10 and n drain buffer layer 34, is around 100 µm. LOCOS oxide film 35 is formed on the n⁻ drift drain layer.

High-potential wiring (hereinafter referred to as "HV wiring") 9 from HV NMOSFET 20 to HV floating region 22 including a high-side driver circuit is connected from drain electrode 8 (the connection point is not illustrated) with an aluminum metal wiring (wiring with a metal film). HV wiring 9 is bridged from drain electrode 8 to HV floating region 22 crossing over the innermost trench 4a among three trenches 4a constituting multiple-trench isolation belt 21.

In the portion of n⁻ semiconductor layer 1 in the region of HV NMOSFET 20 and below HV wiring 9, led out from drain electrode 8 with interlayer insulator film 5 interposed between n⁻ semiconductor layer 1 and HV wiring 9, neither n⁺ source layer 31 nor p well diffusion layer 10 is formed.

In the above-described portion of n⁻ semiconductor layer 1, p⁻ diffusion layer 11, formed in contact with n drain buffer layer 34, and p⁺ diffusion layer 12, formed in adjacent to p⁻ diffusion layer 11 and on the trench 4a side, are arranged.

The impurity concentration in p⁻ diffusion layer 11 is low, from $1.0 \times 10^{16}$ cm⁻³ to $5 \times 10^{16}$ cm⁻³. The diffusion depth Xj of p⁻ diffusion layer 11 is around 1.5 µm. The impurity concentration in p⁺ diffusion layer 12 is high, from $6 \times 10^{16}$ cm⁻³ to $1 \times 10^{18}$ cm⁻³. The diffusion depth Xj of p⁺ diffusion layer 12 is around 3 µm.

To utilize the same manufacturing steps, p well diffusion layer 10 and p⁺ diffusion layer 12 are formed such that these layers are not in contact with each other so that the same mask, the same implantation step and the same diffusion step may be employed.

The spacing L1, across which p well diffusion layer 10 and p⁺ diffusion layer 12 are facing to each other, is set to be equal to or longer than the spacing L2, across which p well diffusion layer 10 and n drain buffer layer 34 are facing to each other (L1≧L2). By the setting described above, the electric field localization in insulator film 44a in the portion, in which trench 4a and HV wiring 9 cross each other, is reduced.

Since a high voltage of several hundred V is applied to HV floating region 22 every time the gate of the above-described high-voltage switching device in the outside is turned on and off, a high-voltage device isolation structure is formed by multiple-trench isolation belt 21 in the edge area of HV floating region 22.

In multiple-trench isolation belt 21, multiple (three in FIG. 1) trenches 4a are arranged in parallel to each other. Each trench 4a works as a capacitive potential divider so that a high potential as well as the ground (GND) potential may be isolated.

Multiple-trench isolation belt 21 surrounding HV floating region 22 is connected to trench 4 in the edge area of HV NMOSFET 20. Therefore, trench 4 is formed as one of trenches 4a. Trench 4 and trenches 4a are connected to each other in the portion between trenches 4 and 4a and n⁺ drain layer 33, in which p well diffusion layer 10 is not formed. Trench 4 is butted to the side wall of innermost trench 4a and the other trenches 4a are butted to the side wall of trench 4 such that each trench connection is shape with a letter T in the planar pattern thereof. The butting angle θ (cf. FIG. 4) at the T-shaped trench connection is set at any angle between 60 and 120 degrees of angle. The butting angle described above provides an excellent final trench shape and facilitates burying a silicon oxide film in the trenches without any hazard. Therefore, the isolation performance reliability is improved.

The T-shaped connections are arranged with a predetermined spacing left between the connections such that the potentials at the respective T-shaped connections change stepwise from the ground potential to a high potential.

Alternatively, the connection of trench 4, surrounding HV NMOSFET 20, to multiple-trench isolation belt 21, including three trenches 4a surrounding HV floating region 22, may be conducted in the following manner. Trench 4 is shaped with a perfect circular closed loop and trenches 4a in multiple-trench isolation belt 21 are bent and connected to trench 4 in a pattern of letter T. In this case, HV wiring 9 is bridged to HV floating region 22 crossing over trench 4.

Now the case in which a reverse bias voltage is applied to the pn-junction between p well diffusion layer 10 and n⁻ semiconductor layer 1 in HV NMOSFET 20 will be described. As supporting base 3, source electrode 6 and gate electrode 7 are fixed at the ground (GND) potential and a positive (+) bias voltage applied to drain electrode 8 is raised gradually, a depletion layer extends from the pn-junction between p well diffusion layer 10 and n⁻ semiconductor layer 1 in HV NMOSFET 20. Since supporting base 3 is fixed at the GND potential, a depletion layer extends also from the boundary between buried dielectric layer 2 and n⁻ semiconductor layer 1.

Figure 3A:
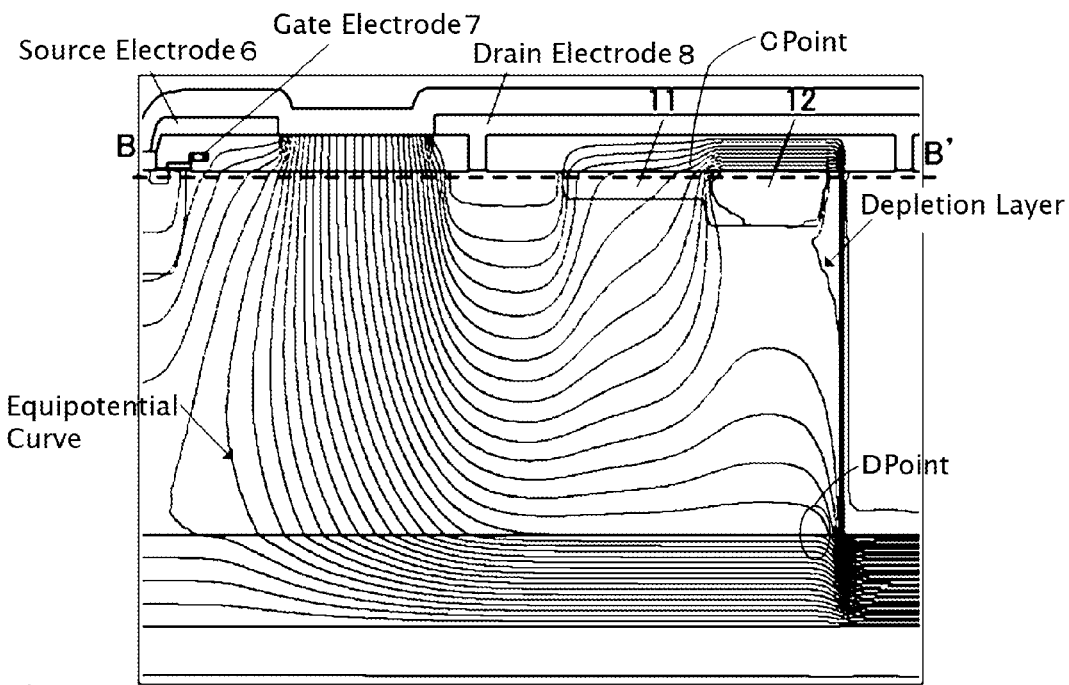
FIG. 3(a) is a chart describing the equipotential curve distribution obtained by two-dimensional device simulation in a cross section of the semiconductor apparatus according to the first embodiment.
Figure 3B:
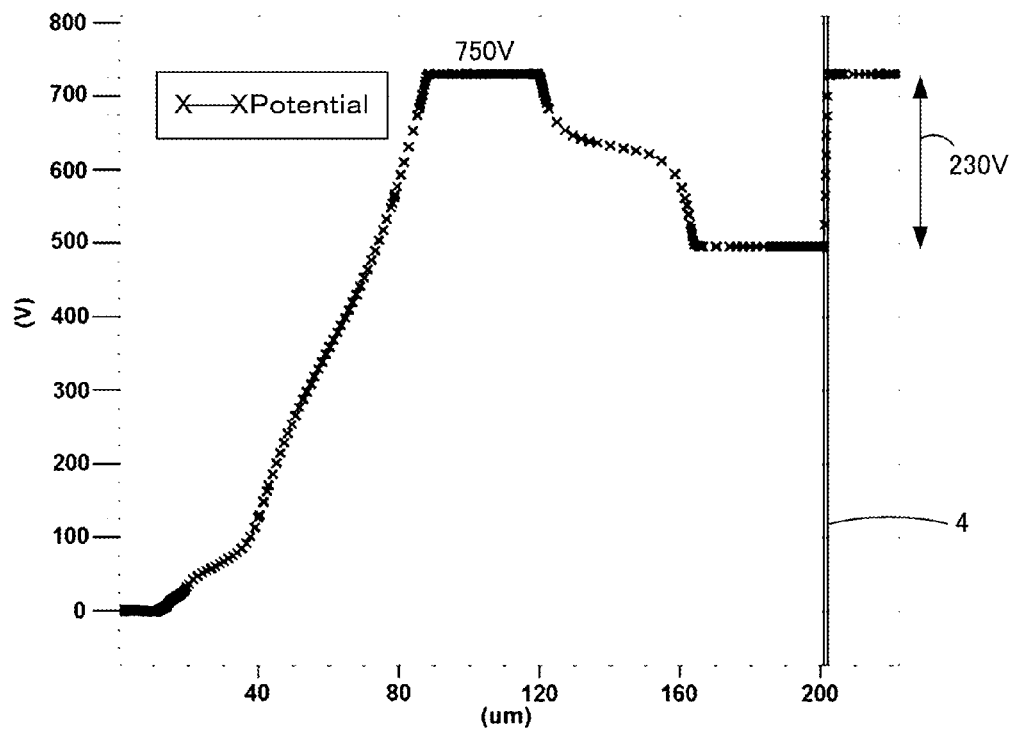
FIG. 3(b) is a potential distribution chart describing the potential distribution along the broken line B-B' in FIG. 3(a).

FIG. 3(a) is a chart describing the equipotential curve distribution obtained by two-dimensional device simulation in a cross section of semiconductor apparatus 100. FIG. 3(b) is a potential distribution chart describing the potential distribution along the broken line B-B' in FIG. 3(a). The equipotential curves and the potential distribution curve are obtained in the case, in which a voltage of 750 V is applied to drain electrode 8 in HV NMOSFET 20.

As described in FIG. 3(b), the potential distributes with a uniform gradient between n⁺ source layer 31 and n⁺ drain layer 33. The potential drop from n⁺ drain layer 33 to p⁺ diffusion layer 12 is small, indicating that the potential does not fall to the ground (GND) potential in the edge area (between p⁺ diffusion layer 12 and trench 4a).

The reason for this is as follows. When a voltage of 750 V is applied to drain electrode 8, p⁻ diffusion layer 11 in contact with n drain buffer layer 34 is depleted completely. The depletion layer stops in p⁺ diffusion layer 12. Beneath HV wiring 9, p⁺ diffusion layer 12 is maintained at an intermediate potential (here 500 V) and the intermediate potential is maintained to trench oxide film 44a in the edge area.

The p⁻ diffusion layer 11 is made to be in contact with n drain buffer layer 34 to make a depletion layer easier to extend from the pn-junction between n drain buffer layer 34, doped more heavily than n⁻ semiconductor layer 1, and p⁻ diffusion layer 11, when a high voltage is applied to drain electrode 8. The p⁻ diffusion layer 11 is made to be in contact with n drain buffer layer 34 also for suppressing the electric field strength to be low in insulator film 44a in trench 4a constituting multiple-trench isolation belt 21 corresponding to the boundary between HV floating region 22, to which HV wiring 9 is connected, and HV NMOSFET 20.

Figure 4:
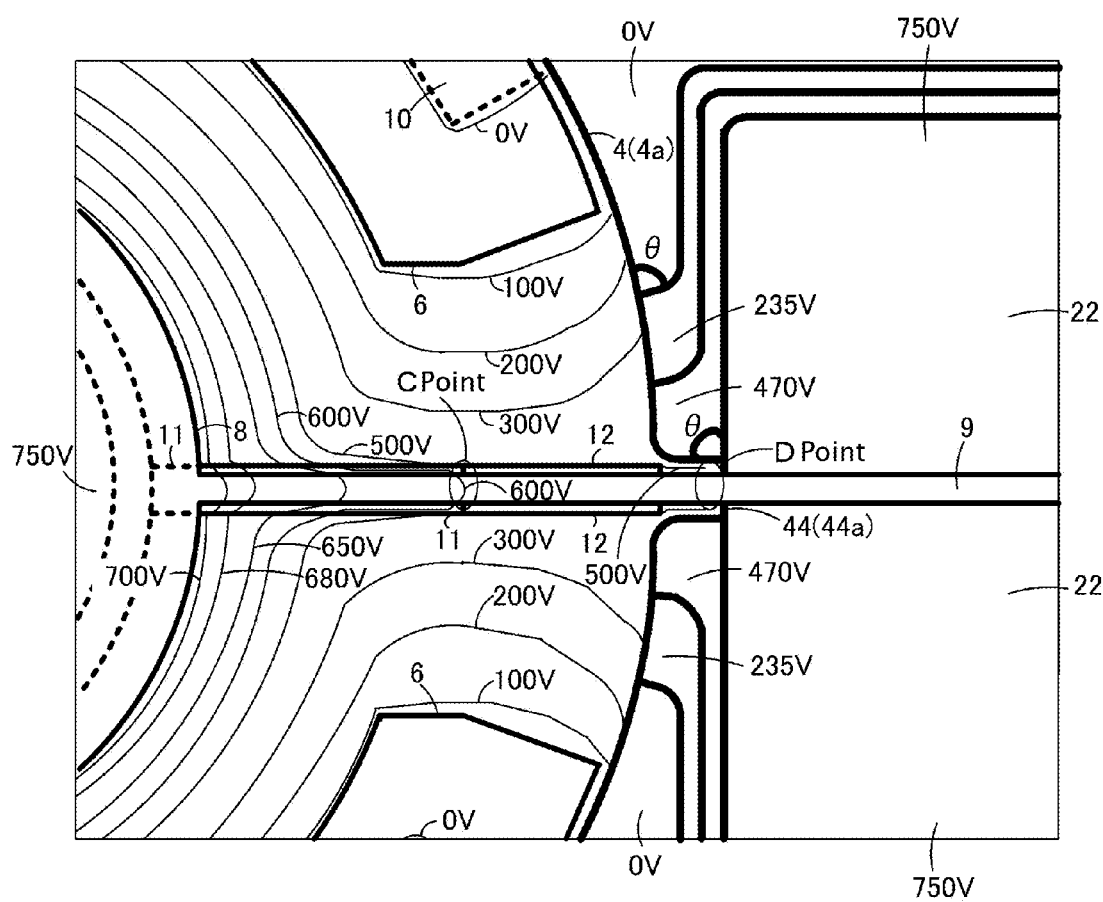
FIG. 4 is a chart describing the planar equipotential curve distribution obtained by applying a voltage of 750 V to the n+ drain layer in the high-voltage NMOSFET according to the first embodiment.

FIG. 4 is a chart describing the planar equipotential curve distribution obtained by applying a voltage of 750 V to n⁺ drain layer 33.

Since any portion, in which a sharp potential gradient is caused, is not caused in the vicinity of HV wiring 9 two-dimensionally, it is possible to connect HV wiring 9 from HV NMOSFET 20 to HV floating region 22 without causing any lowering of breakdown voltage.

By the long-term reliability tests, conducted on test specimens, in which HV wiring 9 crosses over trench 4a for the dielectric isolation of NMOSFET 20 and HV floating region 22, by applying a DC bias voltage of 600 V to drain electrode 8 in HV NMOSFET 20, it is confirmed that the breakdown voltage is prevented from lowering.

Figure 5:
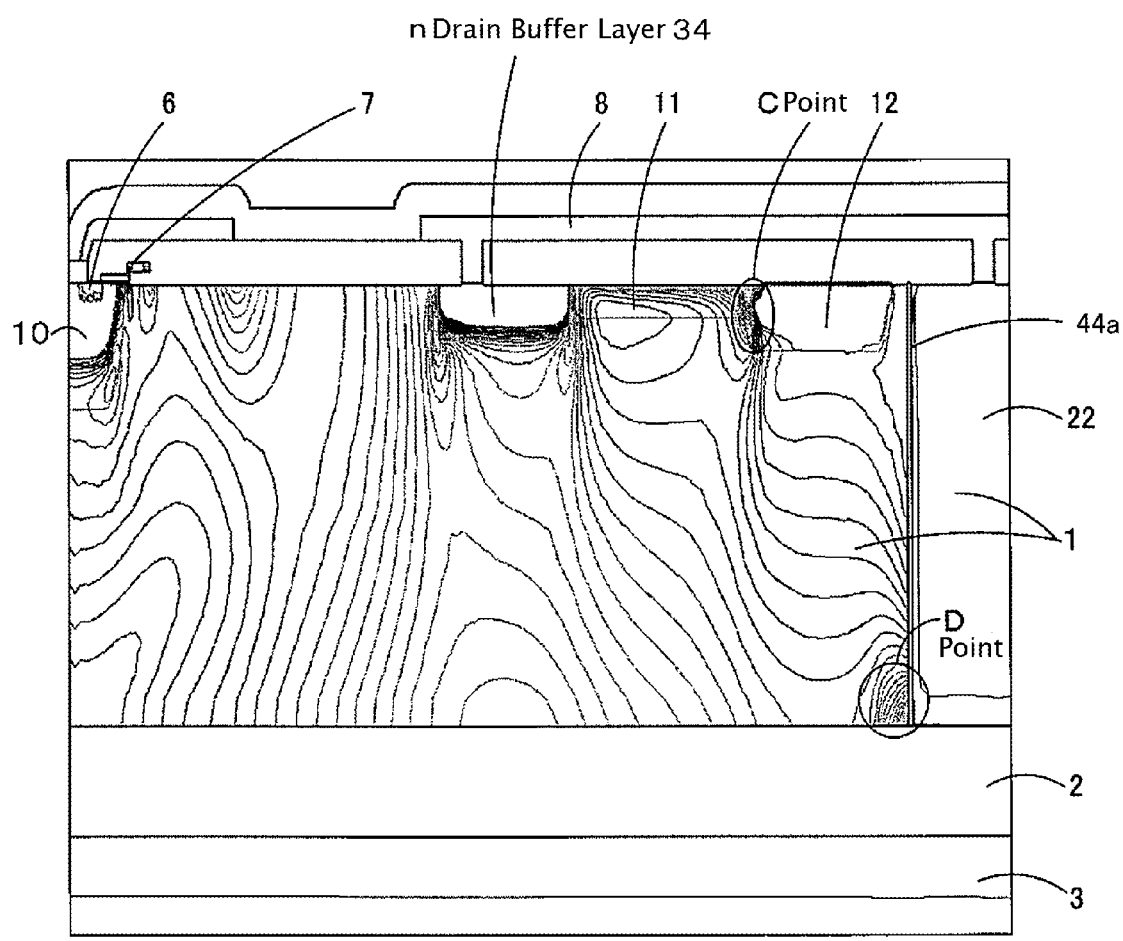
FIG. 5 is a chart describing the electric field strength distribution obtained by two-dimensional device simulation, in which a bias voltage of 730 V is applied to the drain electrode of the high-voltage NMOSFET according to the first embodiment.

From the electric field strength distribution chart obtained by two-dimensional device simulation, in which a bias voltage of 730 V is applied to drain electrode 8 in HV NMOSFET 20 shown in FIG. 5, it is possible to explain that the performances of HV NMOSFET 20 do not vary in the long-term reliability test.

When the bias voltage of 730 V is applied to drain electrode 8, electric field localization is caused at the point C shown in FIG. 5, which is the junction portion between p⁻ diffusion layer 11 in contact with n drain buffer layer 34 and p⁺ diffusion layer 12. Electric field localization is caused also at the point D shown in FIG. 5, which is a bottom corner portion between insulator film 44a in trench 4a and n⁻ semiconductor layer 1.

However, the voltage applied to insulator film 44a in trench 4a in semiconductor apparatus 100 according to the invention is lower than the voltage applied to the insulator film in semiconductor apparatus 300 according to a comparative example. The electric field strength in insulator film 44a in semiconductor apparatus 100 is lower than the electric field strength in trench insulator film 44a in semiconductor apparatus 300. Therefore, the isolation performance of semiconductor apparatus 100 according to the invention is hardly affected by the defects caused in the oxide film through the steps of forming insulator film 44a.

Above the points C and D shown in FIG. 5, at which electric field localization is caused, HV wiring 9 is formed with a metal wiring, exhibiting a shielding effect. Therefore, the long-term reliability of the breakdown voltage characteristics, which semiconductor apparatus 100 according to the invention exhibits, is hardly affected by the moveable ions moving in the mold resin and by the surface charge creep. For example, the breakdown voltage lowering caused in semiconductor apparatus 100 by the long-term use thereof is suppressed to be small. In summary, the long-term reliability of semiconductor apparatus 100 is improved.

In FIG. 1, gate electrode 7 and n⁺ source layer 31 are formed on the left-hand-side half of p well diffusion layer 10. If gate electrode 7 and n⁺ source layer 31 are extended onto the right-hand-side half of p well diffusion layer 10 in FIG. 1, the current capacity of HV MOSFET 20 will be increased. In this case, if the spacing between HV wiring 9 and source electrode 6 facing thereto is set to be equal to or longer than the spacing between source electrode 6 and drain electrode 8 formed in the left-hand-side half, the breakdown voltage between HV wiring 9 and source electrode 6 will be secured.

Now comparative semiconductor apparatus 300, in which n drain buffer layer 34 and p⁻ diffusion layer 11 are spaced apart from each other, will be described below with reference to FIGS. 6, 7(a) and 7(b) for comparing with semiconductor apparatus 100 according to the first embodiment.

Figure 6:
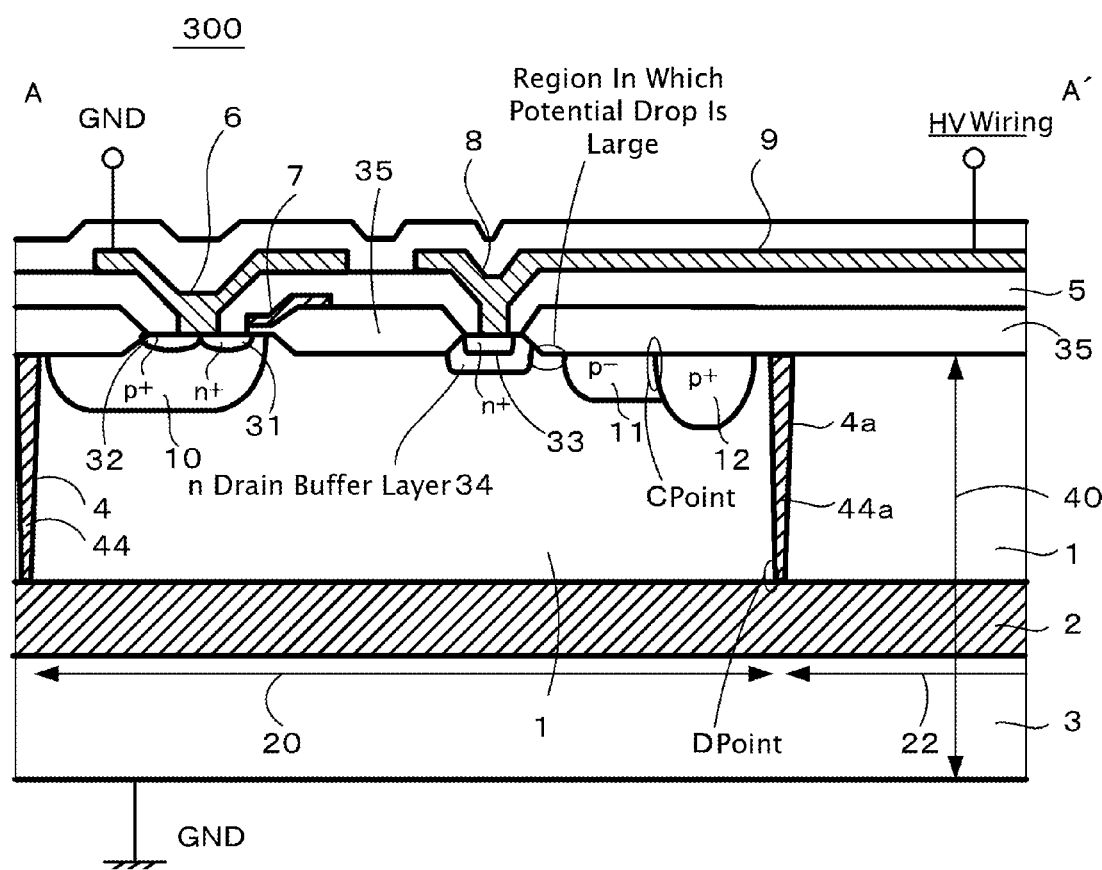
FIG. 6 is a cross sectional view of a comparative semiconductor apparatus according to a comparative example, in which an n drain buffer layer and a p− diffusion layer are spaced apart from each other.
Figure 7A:
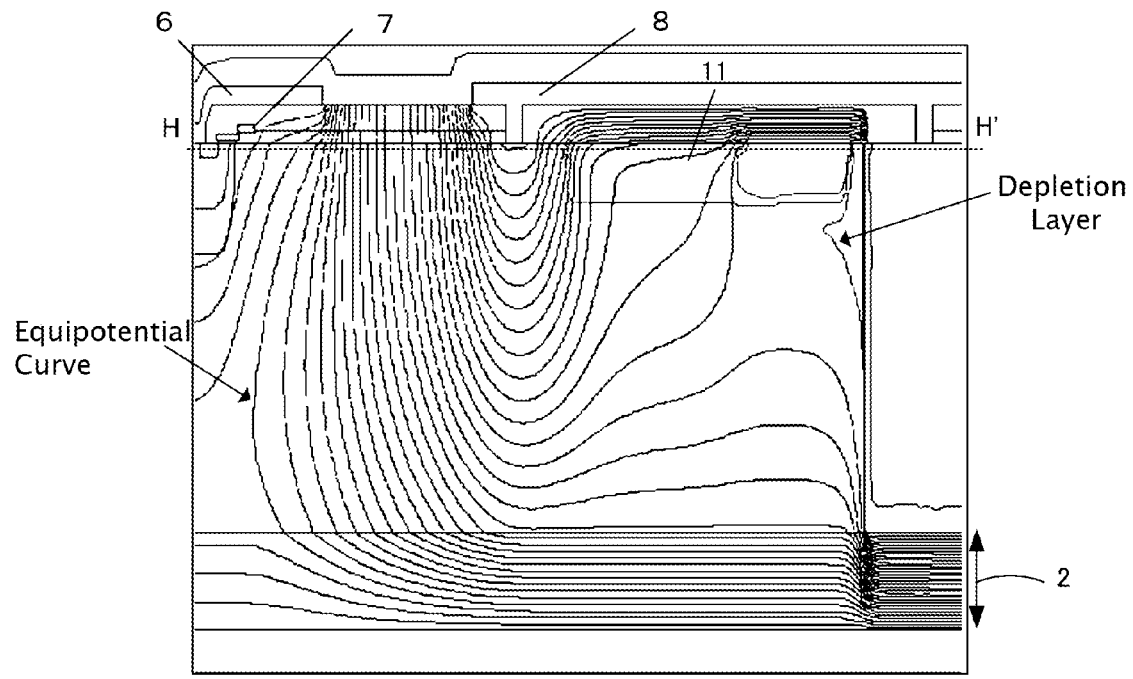
FIG. 7(a) is a chart describing the equipotential curve distribution obtained by two-dimensional device simulation in a cross section of the comparative semiconductor apparatus.

FIG. 6 is a cross sectional view of semiconductor apparatus 300, in which n drain buffer layer 34 and p⁻ diffusion layer 11 are spaced apart from each other. FIG. 7(a) is a chart describing the equipotential curve distribution obtained by two-dimensional device simulation in a cross section of comparative semiconductor apparatus 300. FIG. 7(b) is a potential distribution chart describing the potential distribution along the broken line H-H' in FIG. 7(a).

As shown in FIG. 6, n drain buffer layer 34 and p⁻ diffusion layer 11 (p⁻ floating potential region) are spaced apart from each other. As described in FIGS. 7(a) and 7(b), a large potential drop (around 200 V) is caused in the portion of n⁻ semiconductor layer 1 between n drain buffer layer 34 and p⁻ diffusion layer 11.

Figure 7B:
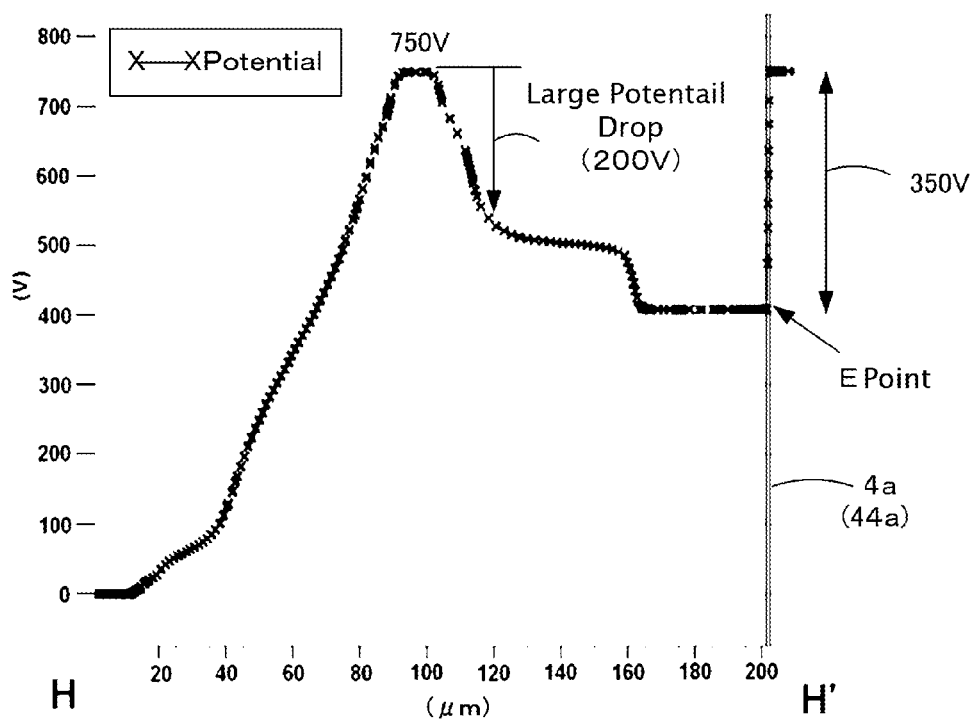
FIG. 7(b) is a potential distribution chart describing the potential distribution along the broken line H-H' in FIG. 7(a).

Therefore, the potential in the portion of n⁻ semiconductor layer 1 in contact with insulator film 44a (point E in FIG. 7(b)) on the boundary between n⁻ semiconductor layer 1 and HV floating region 22, to which HV wiring 9 is connected, drops about 350 V. The corresponding voltage drop in semiconductor apparatus 100 according to the first embodiment is 230 V as described in FIG. 3(b).

When HV wiring 9 biased as high as 750 V is bridged to HV floating region 22 crossing over insulator film 44a, a voltage drop of around 350 V is caused across insulator film 44a in the vicinity of H' in FIG. 7(b). Therefore, the strength of the electric field applied to insulator film 44a below HV wiring 9 will be 3.5 MV/cm or higher, if the trench width is 1 µm.

If an electric field, the strength of which is 3 MV/cm or higher, is applied continuously to insulator film 44a, oxide film defects (cracks, etc.) are caused from the defective portions in the trench side wall such as anomalous shapes due to voids, rough surfaces, etc. and from the portions, in which the trench is narrow locally.

As a result, the isolation performance of insulator film 44a in the structure shown in FIG. 6, in which n drain buffer layer 34 and p$^-$ diffusion layer 11 are spaced apart from each other, will be impaired in the long-term use. To avoid this problem, the electric field strength in insulator film 44a may be relaxed by widening the trench. However, if the trench is widened, voids will be caused between the insulator film (silicon oxide film) and the trench side wall in the step of burying the insulator film in the trench after the step of trench etching and this will be hazardous to a stable manufacturing process.

Therefore, it is effective to make n drain buffer layer 34 and p$^-$ diffusion layer 11 contact each other in the same manner as in semiconductor apparatus 100 according to the first embodiment.

Although n drain buffer layer 34 is effective to expand the depletion layer and to lower the electric field strength, it is not always necessary to dispose n drain buffer layer 34 in the semiconductor apparatus, the breakdown voltage of which is low. In this case, p$^-$ diffusion layer 11 and n$^+$ drain layer 33 are made to be in contact with each other.

The above descriptions may be summarized as follows.

If the high-voltage wiring structure in semiconductor apparatus 100 according to first embodiment of the invention is employed, neither n$^+$ source layer 31 nor p well diffusion layer 10 will be formed below HV wiring 9 led out from drain electrode 8. Since HV wiring 9 never crosses over the regions at the ground potential, interlayer insulator film 5 and LOCOS oxide film 35 never result in dielectric breakdown.

When a high voltage (e.g., 750 V) is applied to drain electrode 8, p$^-$ diffusion layer 11, in contact with n drain buffer layer 34 formed in n$^-$ semiconductor layer 1 of HV HMOSFET 20 below HV wiring 9 led out from drain electrode 8, is depleted completely. Therefore the electric field in the silicon surface is relaxed and the potential gradient in the silicon surface is made to be gentle.

The p$^+$ diffusion layer 12, in contact with p$^-$ diffusion layer 11 and located on the side of trench 4a, stops the depletion layer extending from p$^-$ diffusion layer 11 and takes over the potential shared by the junction between n drain buffer layer 34 and p$^-$ diffusion layer 11. As a result, p$^+$ diffusion layer 12 is fixed at an intermediate potential (e.g., 500 V).

Since n drain buffer layer 34 and p$^-$ diffusion layer 11 are made to be in contact with each other, it is possible to reduce the potential difference in the vicinity of insulator film 44a below HV wiring 9. As a result, the potential difference between HV floating region 22 and insulator film 44a is reduced and the electric field in the vicinity of n$^-$ semiconductor layer 1 and insulator film 44a below HV wiring 9 is relaxed. Therefore, insulator film 44a is prevented from being broken down and the breakdown voltage thereof is prevented from being impaired.

Due to the structure described above, it is possible to narrow the trench opening width for forming trenches 4 and 4a. Since any concave portion is not caused in burying an insulator film such as a silicon oxide film in trenches 4 and 4a, it is possible to omit the step of filling the concave portion with polycrystalline silicon. Moreover, the subsequent step of flattening interlayer insulator film (ILD) 5 may be omitted.

Due to the T-shaped connection of trenches 4a to trench 4, the inner side wall of trench 4 sustains the potential stepwise (from 0 V to 500 V stepwise in FIG. 4) in the vicinity of HV wiring 9 inside HV NMOSFET 20. Therefore, multiple-trench isolation belt 21 of HV floating region 22 facilitates exhibiting a stable device isolation performance without impairing the isolation breakdown voltage.

The high-voltage wiring structure according to the invention makes additional pad areas unnecessary, if compared with the high-voltage wiring by wire bonding, and facilitates reducing the areas of the connection portions in HV NMOSFET 20 (level shifter) and HV floating region 22. Therefore, the high-voltage wiring structure according to the invention facilitates reducing the IC area, when the semiconductor apparatus according to the first embodiment of the invention is integrated into a one-chip IC.

Second Embodiment

Figure 8:
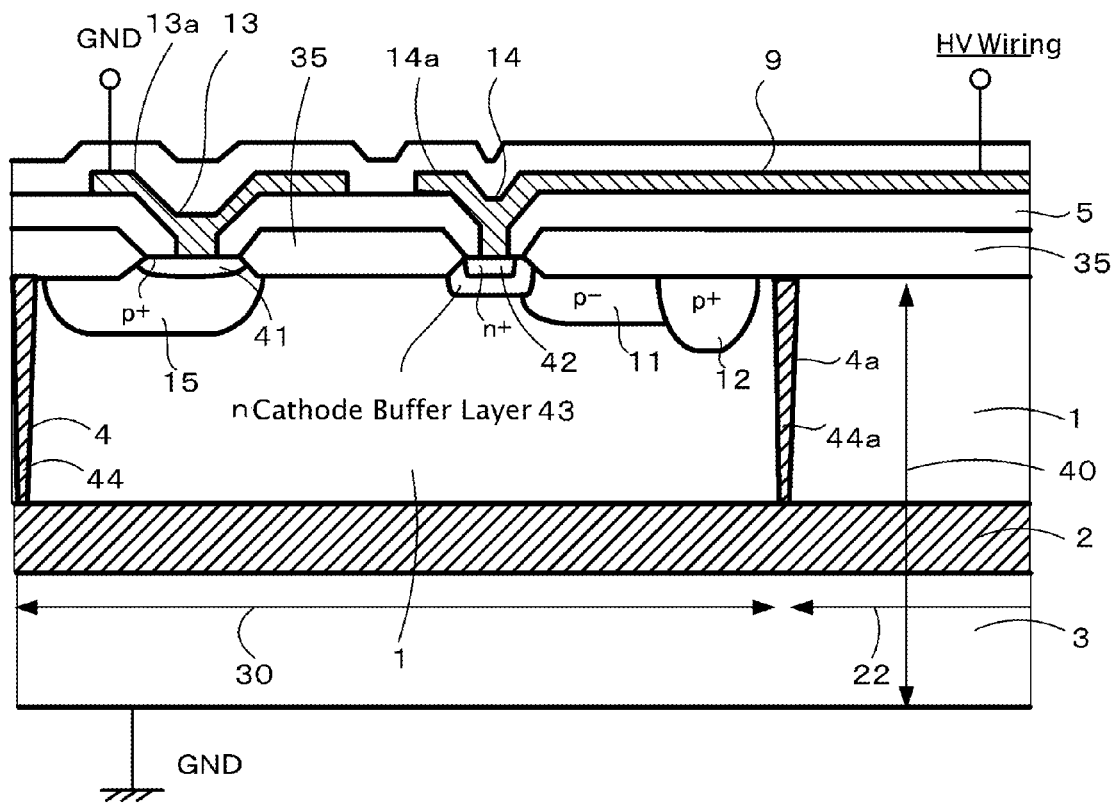
FIG. 8 is a cross sectional view of a semiconductor apparatus according to a second embodiment of the invention.
Figure 9A:
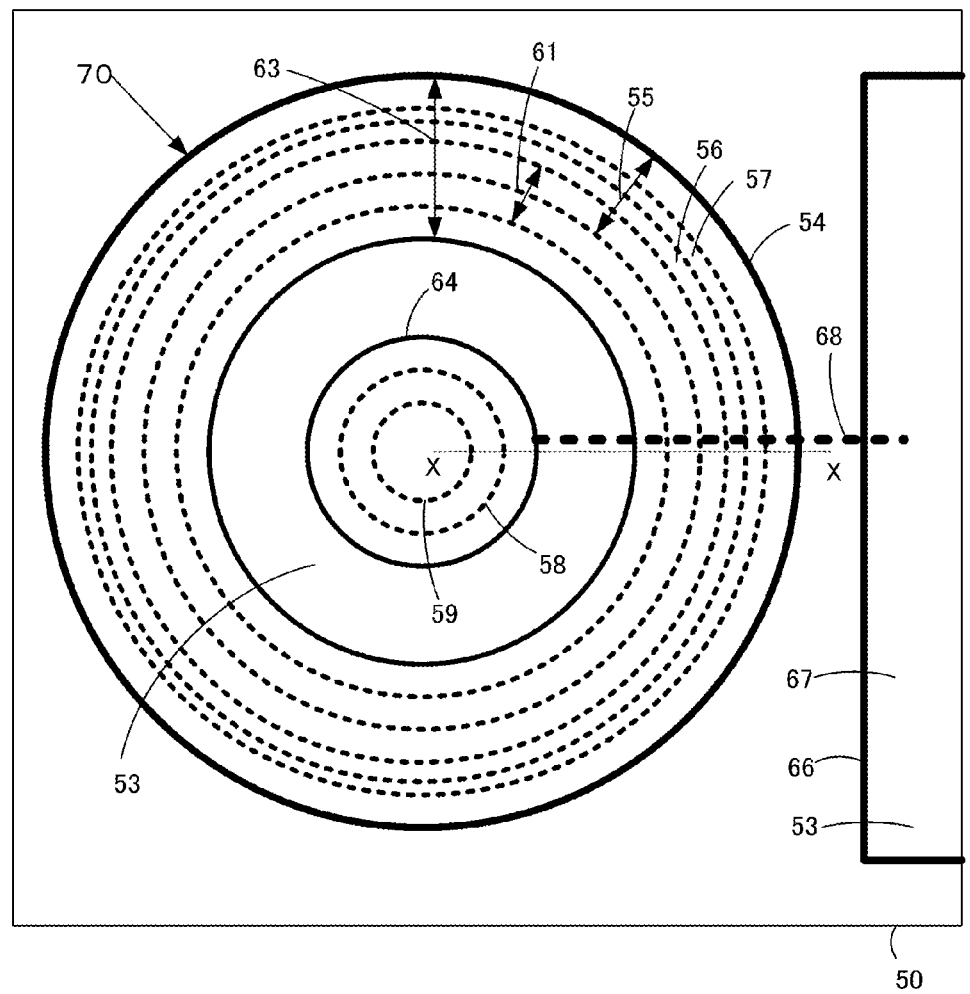
FIG. 9(a) is the top plan view of a conventional dielectric-isolation-type semiconductor apparatus.
Figure 9B:
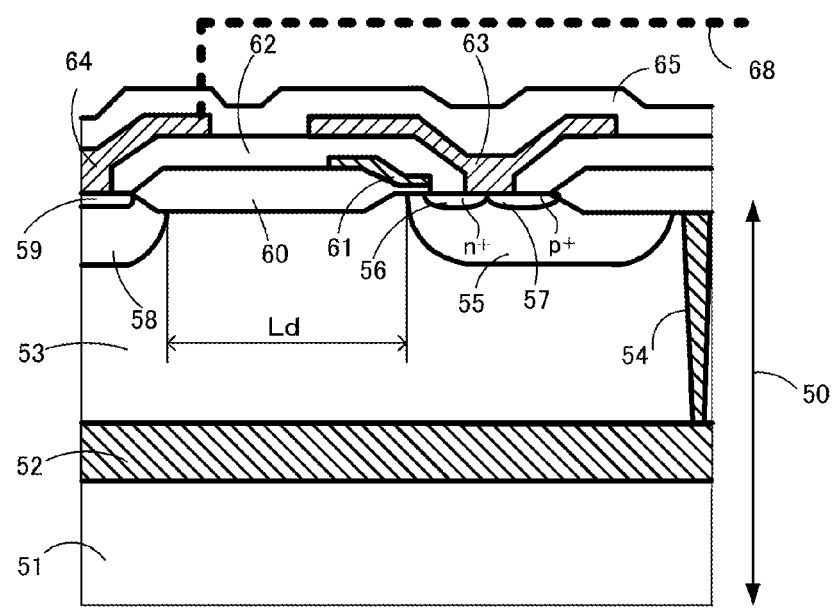
FIG. 9(b) is the cross sectional view along the broken line X-X in FIG. 9(a).
Figure 10A:
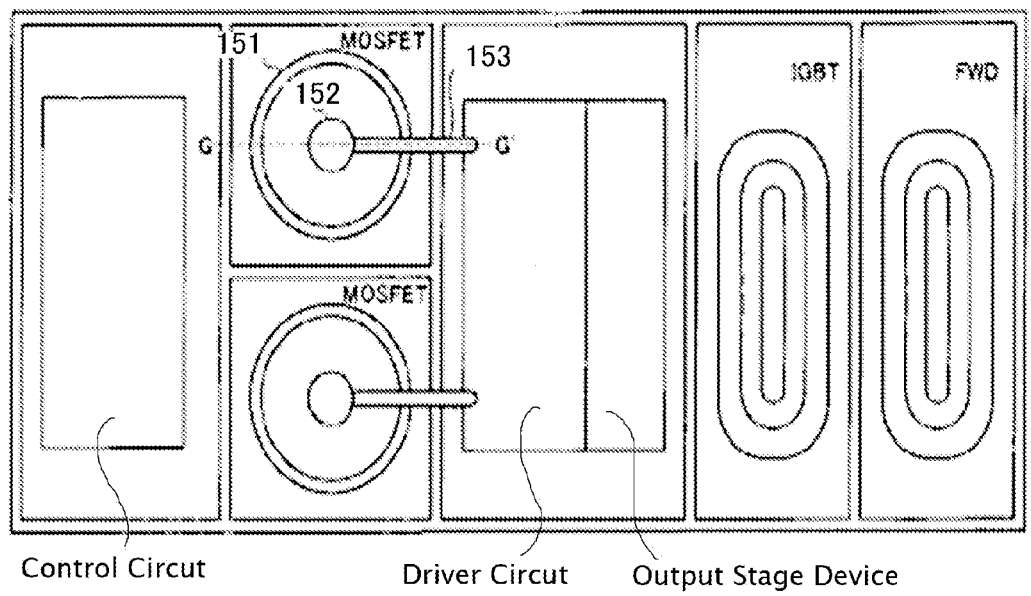
FIG. 10(a) is the floor plan of a conventional one-chip inverter.
Figure 10B:
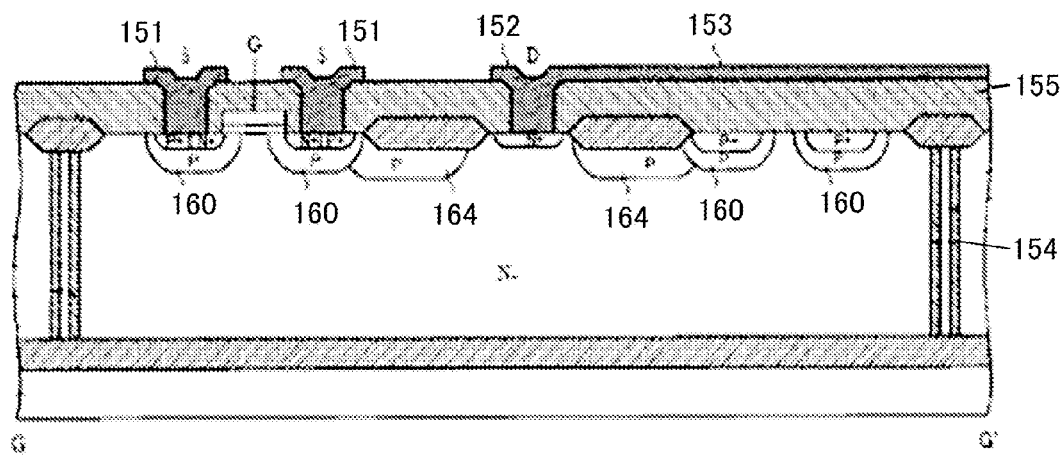
FIG. 10(b) is the cross sectional view along the single-dotted chain line G-G' in FIG. 10(a).
Figure 11:
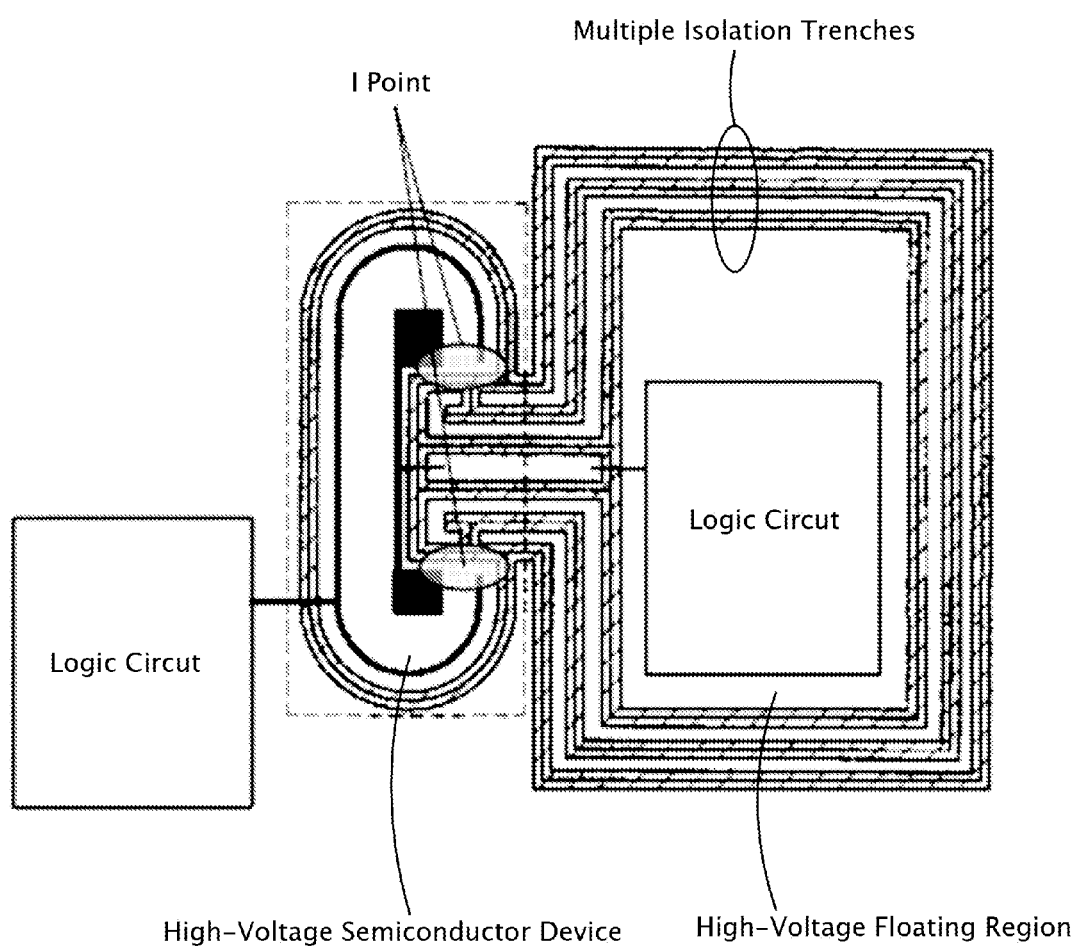
FIG. 11 is a floor plan of a conventional semiconductor apparatus, in which a multiple-trench separation region (multiple separation trenches) and a high-voltage semiconductor device are in contact with each other.
Figure 12A:
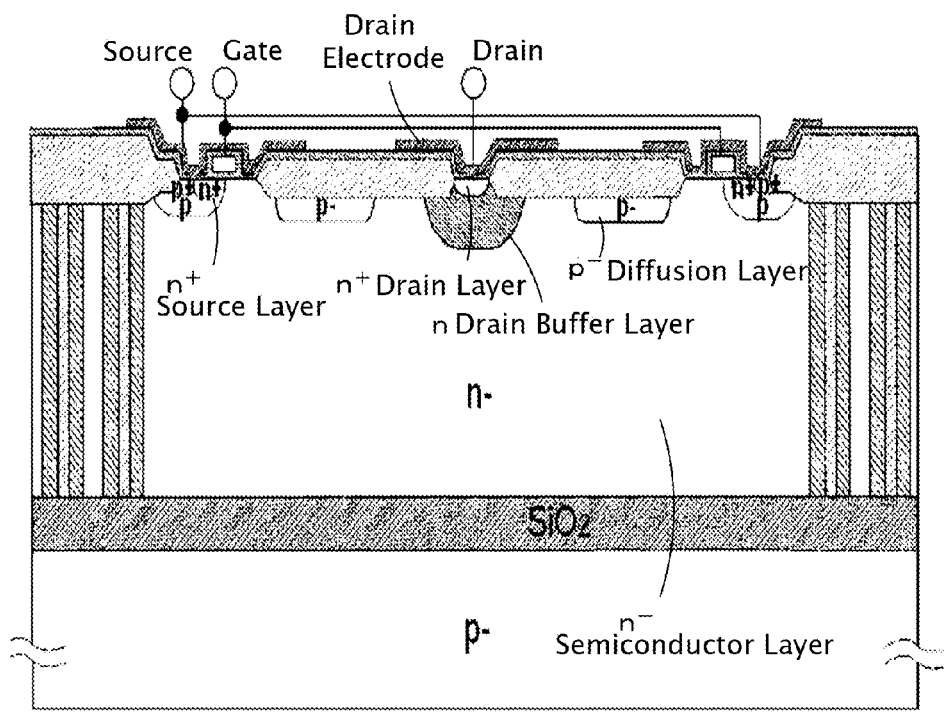
FIG. 12(a) is a cross sectional view of the semiconductor apparatus disclosed in Japanese Unexamined Patent Application Publication No. 2008-244092.
Figure 12B:
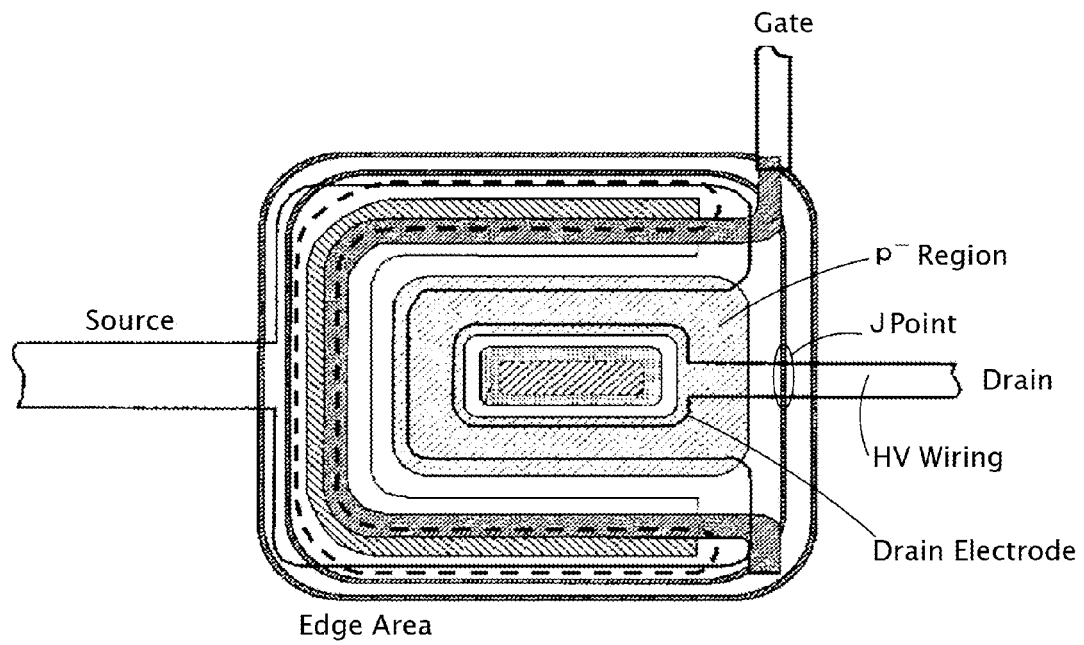
FIG. 12(b) is a top plan view of the semiconductor apparatus disclosed in Japanese Unexamined Patent Application Publication No. 2008-244092.

FIG. 8 is a cross sectional view of a semiconductor apparatus according to a second embodiment of the invention.

Semiconductor apparatus 200 according to the second embodiment is different from semiconductor apparatus 100 according to the first embodiment in that HV NMOSFET 20 according to the first embodiment is replaced by high-voltage diode (hereinafter referred to as "HV diode") 30 in semiconductor apparatus 200 according to the second embodiment.

Gate electrode 7 in FIG. 2 is not formed for obtaining a diode structure. The polysilicon used for the gate is short-circuited to anode electrode 13 or removed. Anode electrode 13 is formed. Below anode electrode 13, p$^+$ anode layer 41 and p well diffusion layer 15 are formed. On the side to which a high voltage is applied, cathode electrode 14 and n$^+$ cathode layer 42 are formed. Cathode electrode 14 and n$^+$ cathode layer 42 are spaced apart from p$^+$ anode layer 41 and p well diffusion layer 15 by a field oxide film, which is a part of LOCOS oxide film 35, and n$^-$ semiconductor layer 1, which is an n$^-$ drift drain layer. In the surface portion of n cathode buffer layer 43, n$^+$ cathode layer 42 is formed.

The depletion layer expansion in each diffusion layer, the electric field distribution and the potential distribution, obtained by applying a high voltage to cathode electrode 14 and HV wiring 9 led out therefrom, are the same as those according to the first embodiment. Semiconductor apparatus 200 according to the second embodiment exhibits the same effects as semiconductor apparatus 100 according to the first embodiment exhibits. Semiconductor apparatus 200 according to the second embodiment exhibits the breakdown voltage characteristics the same with the breakdown voltage characteristics, which semiconductor apparatus 100 according to the first embodiment exhibits.

Anode electrode 13 and cathode electrode 14 include field plate electrodes 13a and 14a extended therefrom, respectively.

In order to integrate HV diode 30 into a one-chip HVIC, it is necessary to incorporate a bootstrap diode for charging an exterior bootstrap capacitor indispensable to the high-side driver circuit. The bootstrap diode incorporated into an HVIC facilitates charging the bootstrap capacitor without making the forward current leak to supporting base board 3 or to the ground region, since SOI substrate 40 is employed.

The bootstrap diode is a diode necessary for charging the bootstrap capacitor working as the power supply to the high-side circuit. It is required for the bootstrap diode to exhibit the breakdown voltage characteristics of several hundred V or higher.

Thus, a semiconductor device has been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

This application is based on and claims priority to Japanese Patent Application 2009-251946, filed on Nov. 2, 2009. The disclosure of the priority application in its entirety, including the drawings, claims, and the specification thereof, is incorporated herein by reference.

What is claimed is:

1. A semiconductor apparatus comprising:
a supporting base;
a first insulator film on the supporting base;
a semiconductor layer of a first conductivity type on the first insulator film;
a trench extended from a surface of the semiconductor layer to the first insulator film, the trench comprising a second insulator film buried therein;
a first semiconductor layer of the first conductivity type surrounded by the trenches;
a second semiconductor layer of the first conductivity type in a surface portion of one of the first semiconductor layers, the second semiconductor layer being doped more heavily than the first semiconductor layer;
a third semiconductor layer of a second conductivity type in the surface portion of the one of the first semiconductor layers, the third semiconductor layer being formed selectively around the second semiconductor layer with a spacing left between the third semiconductor layer and the second semiconductor layer;
a fourth semiconductor layer of the first conductivity type in a surface portion of the third semiconductor layer, the fourth semiconductor layer being doped more heavily than the third semiconductor layer;
a fifth semiconductor layer of the second conductivity type in the surface portion of the third semiconductor layer, the fifth semiconductor layer being doped more heavily than the third semiconductor layer;
a first main electrode in contact with the second semiconductor layer;
a second main electrode in contact with the fourth and fifth semiconductor layers;
a gate electrode above an extended portion of the third semiconductor layer extended between the fourth semiconductor layer and the one of the first semiconductor layers with a gate insulator film interposed between the gate electrode and the extended portion;
a sixth semiconductor layer of the second conductivity type in the surface portion of the one of first semiconductor layers, the sixth semiconductor layer being in contact with the second semiconductor layer, the sixth semiconductor layer being extended toward the trench;
a seventh semiconductor layer of the second conductivity type in the surface portion of the one of the first semiconductor layers, the seventh semiconductor layer being in contact with the sixth semiconductor layer, the seventh semiconductor layer being extended toward the trench, the seventh semiconductor layer being doped more heavily than the sixth semiconductor layer;
a high-potential wiring above the sixth and seventh semiconductor layers with a third insulator film interposed between the high-potential wiring and the sixth and seventh semiconductor layers, the high-potential wiring connecting the first main electrode and another one of the first semiconductor layers in adjacent to the one of the first semiconductor layers crossing over the trench; and the third semiconductor layer being spaced apart from the seventh semiconductor layer, so that the third semiconductor layer does not cross the seventh semiconductor layer.

2. The semiconductor apparatus according to claim 1, wherein a spacing, across which the third semiconductor layer and the seventh semiconductor layer are facing to each other, is longer than a spacing, across which the third semiconductor layer and the second semiconductor layer face each other.

3. The semiconductor apparatus according to claim 1, the semiconductor apparatus comprising a MOSFET, wherein
the second semiconductor layer comprises a drain buffer layer and a drain layer in a surface portion of the drain buffer layer or the second semiconductor layer comprises a drain layer,
the third semiconductor layer comprises a well diffusion layer,
the fourth semiconductor layer comprises a source layer, and
the fifth semiconductor layer comprises a pickup layer.

4. The semiconductor apparatus according to claim 1, the semiconductor apparatus further comprising:
a first field plate electrode connected to the first main electrode and extended toward the second main electrode, and
a second field plate electrode connected to the second main electrode and extended toward the first main electrode.

5. The semiconductor apparatus according to claim 1, the semiconductor apparatus comprising:
a high-voltage NMOSFET in the one of the first semiconductor layers, and
a high-potential floating region in the other one of the first semiconductor layers in adjacent to the one of the first semiconductor layers.

6. The semiconductor apparatus according to claim 1, wherein the trenches comprise a first trench surrounding the one of the semiconductor layers and second trenches surrounding the other one of the semiconductor layers, and the first trench is connected to the second trenches in an area in which the third semiconductor layer is not between the second semiconductor layer and the first and second trenches.

7. The semiconductor apparatus according to claim 6, wherein the first trench is butted to a side wall of the second trench or the second trench is butted to a side wall of the first trench in a planar pattern shaped as a letter T and at a butting angle of 60 to 120 degrees of angle measured from a butted one of the trenches as a reference.

8. A semiconductor apparatus comprising:
a supporting base;
a first insulator film on the supporting base;
a semiconductor layer of a first conductivity type on the first insulator film;
a trench extended from a surface of the semiconductor layer to the first insulator film, the trench comprising a second insulator film buried therein;
a first semiconductor layer of the first conductivity type surrounded by the trenches;
a second semiconductor layer of the first conductivity type in a surface portion of one of the first semiconductor layers, the second semiconductor layer being doped more heavily than the first semiconductor layer;
a third semiconductor layer of a second conductivity type in the surface portion of the one of the first semiconductor layers, the third semiconductor layer being formed around the second semiconductor layer with a spacing left between the third semiconductor layer and the second semiconductor layer;

a fifth semiconductor layer of the second conductivity type in a surface portion of the third semiconductor layer, the fifth semiconductor layer being doped more heavily than the third semiconductor layer;

a first main electrode in contact with the second semiconductor layer;

a second main electrode in contact with the fifth semiconductor layer;

a sixth semiconductor layer of the second conductivity type in the surface portion of the one of first semiconductor layers, the sixth semiconductor layer being in contact with the second semiconductor layer, the sixth semiconductor layer being extended toward the trench;

a seventh semiconductor layer of the second conductivity type in the surface portion of the one of the first semiconductor layers, the seventh semiconductor layer being in contact with the sixth semiconductor layer, the seventh semiconductor layer being extended toward the trench, the seventh semiconductor layer being doped more heavily than the sixth semiconductor layer;

a high-potential wiring above the sixth and seventh semiconductor layers with a third insulator film interposed between the high-potential wiring and the sixth and seventh semiconductor layers, the high-potential wiring connecting the first main electrode and another one of the first semiconductor layers in adjacent to the one of the first semiconductor layers crossing over the trench; and the third semiconductor layer being spaced apart from the seventh semiconductor layer, so that the third semiconductor layer does not cross the seventh semiconductor layer.

9. The semiconductor apparatus according to claim 8, the semiconductor apparatus comprising a diode, wherein the second semiconductor layer comprises a cathode buffer layer and a cathode layer in a surface portion of the cathode buffer layer or the second semiconductor layer comprises a cathode layer, and the third semiconductor layer comprises a well diffusion layer and an anode layer in a surface portion of the well diffusion layer or the third semiconductor layer comprises an anode layer.

10. The semiconductor apparatus according to claim 8, the semiconductor apparatus comprising:

a high-voltage diode in the one of the first semiconductor layers, and a high-potential floating region in the other one of the first semiconductor layers in adjacent to the one of the first semiconductor layers.

11. The semiconductor apparatus according to claim 8, wherein a spacing, across which the third semiconductor layer and the seventh semiconductor layer face each other, is longer than a spacing across which the third semiconductor layer and the second semiconductor layer face each other.

12. The semiconductor apparatus according to claim 8, the semiconductor apparatus further comprising:

a first field plate electrode connected to the first main electrode and extended toward the second main electrode, and a second field plate electrode connected to the second main electrode and extended toward the first main electrode.

13. The semiconductor apparatus according to claim 8, wherein the trenches comprise a first trench surrounding the one of the semiconductor layers and second trenches surrounding the other one of the semiconductor layers, and the first trench is connected to the second trenches in an area in which the third semiconductor layer is not between the second semiconductor layer and the first and second trenches.

14. The semiconductor apparatus according to claim 13, wherein the first trench is butted to a side wall of the second trench or the second trench is butted to a side wall of the first trench in a planar pattern shaped as a letter T and at a butting angle of 60 to 120 degrees of angle measured from a butted one of the trenches as a reference.

* * * * *